(12) United States Patent  (10) Patent No.: US 8,049,318 B2
Sugimoto et al.  (45) Date of Patent: Nov. 1, 2011

(54) SEMICONDUCTOR LIGHT EMITTING DEVICE

(75) Inventors: Kunihito Sugimoto, Anan (JP); Koki Matsumoto, Komatsushima (JP)

(73) Assignee: Nichia Corporation, Anan-shi (JP)

( * ) Notice: Subject to any disclaimer, the term of this patent is extended or adjusted under 35 U.S.C. 154(b) by 239 days.

(21) Appl. No.: 12/473,944

(22) Filed: May 28, 2009

(65) Prior Publication Data

US 2009/0294940 A1 Dec. 3, 2009

(30) Foreign Application Priority Data

May 29, 2008 (JP) ................. 2008-140214

(51) Int. Cl.
*H01L 23/10* (2006.01)
(52) U.S. Cl. ................. 257/680; 257/704; 257/E23.193
(58) Field of Classification Search .................. 257/659, 257/E21.536, E23.115, 680, 704, E23.193; 438/761, 106, 109, 111, 113, 125
See application file for complete search history.

(56) References Cited

U.S. PATENT DOCUMENTS 7,084,435 B2 * 8/2006 Sugimoto et al. ............... 257/99
7,378,686 B2 * 5/2008 Beeson et al. ................ 257/100

FOREIGN PATENT DOCUMENTS

| JP | 2003-282953 A | 10/2003 |
| JP | 2004-119881 A | 4/2004 |
| JP | 2004-327955 A | 11/2004 |
| JP | 2007-80859 A | 3/2007 |

* cited by examiner

*Primary Examiner* — Roy Potter
(74) *Attorney, Agent, or Firm* — Birch, Stewart, Kolasch & Birch, LLP

(57) ABSTRACT

The semiconductor device includes a support substrate 101 on which a semiconductor element 105 to be mounted, a covering member 102 disposed to the support substrate via a bonding member, and a space 107 is defined between the covering member 102 and the support substrate 101. The support substrate 101 has a protruded portion 103 and the covering member 102 is disposed so that a portion thereof is in contact with the protruded portion 103 so as to define an air vent leading from the space 107 to outside.

20 Claims, 4 Drawing Sheets

SEMICONDUCTOR LIGHT EMITTING DEVICE

BACKGROUND OF THE INVENTION

1. Field of the Invention

The present invention relates to a semiconductor device such as a light emitting diode, for example, to a semiconductor device housing a high-output power light emitting element which is capable of being used in domestic lighting appliances or lighting for vehicles and has excellent heat resistivity. Particularly, the present invention relates to a semiconductor device to which a reflow mounting process can be performed reliably and safely and which has high reliability even in a high temperature usage environment.

2. Description of the Related Art

A semiconductor light emitting element such as a light emitting diode and a laser diode can be used as a light source of a light emitting device. Further, in recent years, light emitting devices capable of emitting mixed white light by employing a combination of a semiconductor light emitting element and a fluorescent material which absorbs light from the semiconductor light emitting element and emits light have been in practical use for display such as indicator in electric appliances and backlight for liquid crystal displays. In addition, such light emitting devices are expected to be widely used for such as indoor lightings and in-vehicle lightings due to their higher light emitting efficiency and higher luminance.

A typically known semiconductor device includes a semiconductor element which is mounted in a package and is covered with a light translucent coating member such as epoxy resin and silicone resin. The coating member is formed in various shapes such as a lens shape in view of optical property of the semiconductor device.

The semiconductor light emitting elements in such semiconductor devices generate heat when emitting light, and abrupt change in temperature of the entire device causes expansion or contraction of the covering member which is made of a resin. This may adversely affect the light emitting elements and the bonding wires covered with the resin.

Accordingly, there has been proposed a semiconductor device in which a semiconductor element mounted on a support substrate and a thin metal wire connected to the semiconductor element are hermitically sealed with a hollow covering member (for example, see JP 2003-282953A). A semiconductor device described in JP 2003-282953A includes a support substrate mounting a semiconductor element thereon and a sealing member protecting the semiconductor element from external environment, and a hollow portion is defined by the support substrate and the sealing member so as to house the semiconductor element. With such an arrangement, the sealing member does not make contact with the light emitting element or the bonding wires. Therefore, even when the sealing member contracts by abrupt changes in temperature, the resulting stress will not be exerted on the light emitting element or the like.

However, if the hollow portion is hermetically closed by the covering member, the inner pressure of the hollow portion increases due to expansion of the gas enclosed in the hollow portion at the time of mounting the light emitting device by reflow process. As a result, stress is applied to the portion where the sealing member is bonded to the support substrate, which may result in detachment of the sealing member from the support substrate or reduction in the bonding strength, so that a semiconductor device of high reliability cannot be obtained.

Accordingly, there has been proposed a semiconductor device provided with an air vent at a portion leading from the hollow portion to the outside to reduce the gas pressure so that reflow process can be performed stably and reliably (for example, see JP2004-327955A).

However, provision of a hole in the lens body, which is a covering member, has problems such as causing lower mechanical strength and deformation of the covering member. Similar problems may occur if a hole is defined in the reflector. Also, there is a problem if a cutting work is applied to the support substrate, the air vent may be clogged by the bonding member moving thereinto. In addition, there is a problem in defining a hole or cutting processing that, due to the accuracy in such processing, the defined air vent may be somewhat too large to allow foreign matters such as dirt or dust to get in easily while serving as an air vent.

The present invention is devised to solve the aforementioned problems, and an object of the present invention is to provide a semiconductor device provided with an air vent in which reduction in the mechanical strength and deformation of the covering member is prevented and the bonding member is prevented from getting into an unnecessary portion, and an air vent of suitable size can be defined with good productivity and with good accuracy.

SUMMARY OF THE INVENTION

To achieve aforementioned objects, a semiconductor device according to the present invention includes a support substrate on which a semiconductor element is mounted, a covering member disposed to the support substrate via a bonding member, and a space is defined between the covering member and the support substrate. The support substrate has a protruded portion and the covering member is disposed so that a portion thereof is in contact with the protruded portion, to define an air vent leading from the space to outside.

In the semiconductor device, the protruded portion is preferably formed between the portion to dispose the bonding member and the portion to mount the semiconductor element.

Further, it is preferable that the surface of the covering member which is in contact with the support substrate defines a through hole penetrating in vertical direction and the bonding member is disposed on the side surface defining the through hole.

Moreover, it is preferable that the protruded portion has an extended portion extending toward outer periphery of the support substrate and at least a part of the extended portion is exposed without covered by the covering member.

Further, the extended portion is preferably formed symmetrically with respect to the axis of symmetry.

Moreover, it is preferable that at least a pair of the extended portions is formed facing to each other through a gap, and the gap serves as the air vent.

With the semiconductor device according to the present invention, in a semiconductor device provided with an air vent, reduction in the mechanical strength and deformation of the covering member can be prevented and the bonding member can be prevented from getting into an unnecessary portion, and an air vent of suitable size can be defined with good productivity and with good accuracy. With this arrangement, a semiconductor device of high reliability can be manufactured with good yield.

The above and further objects of the present invention as well as the features thereof will become more apparent from the following detailed description to be made in conjunction with the accompanying drawings.

DETAILED DESCRIPTION OF THE EMBODIMENTS

Now the present invention will be described more fully hereinafter by way of preferred embodiments with reference to the accompanying drawings.

First Embodiment

Figure 1:
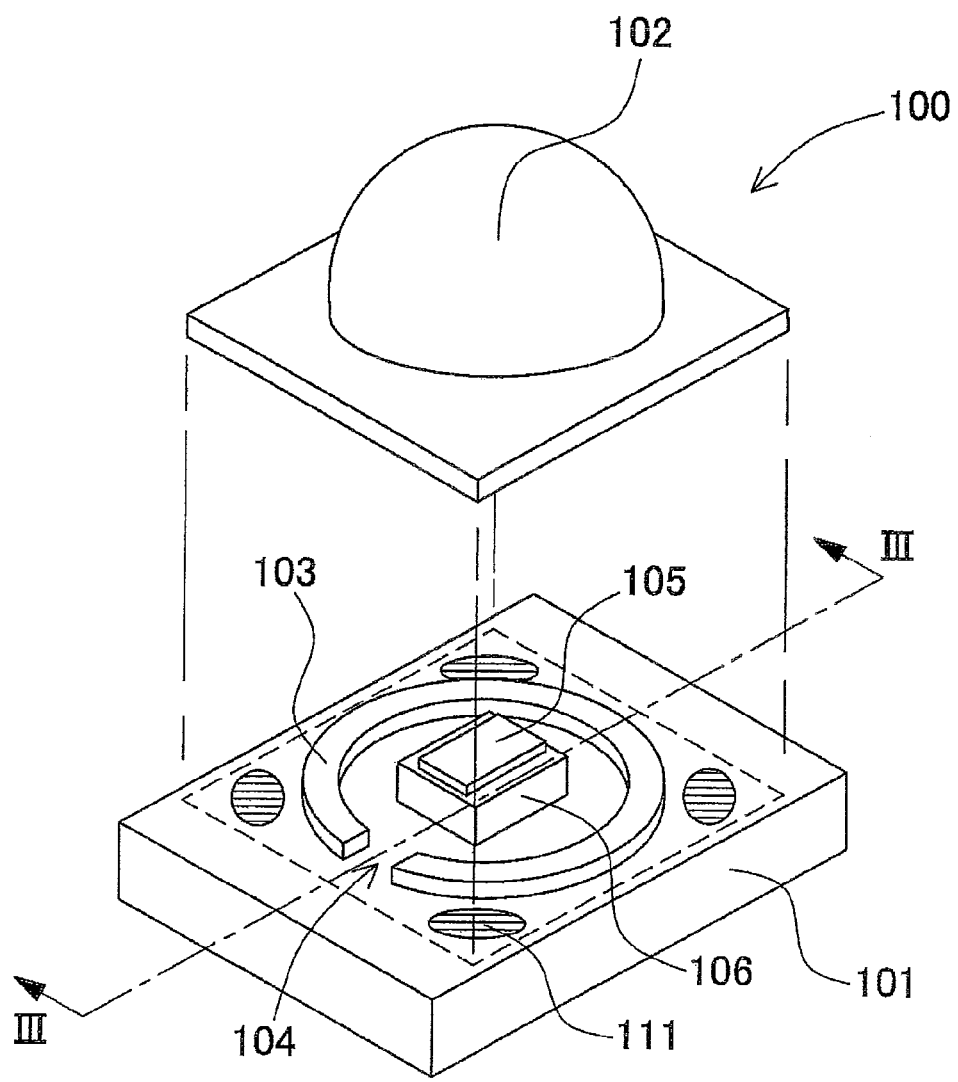
FIG. 1 is a schematic perspective view of a semiconductor device according to a first embodiment of the present invention.
Figure 2:
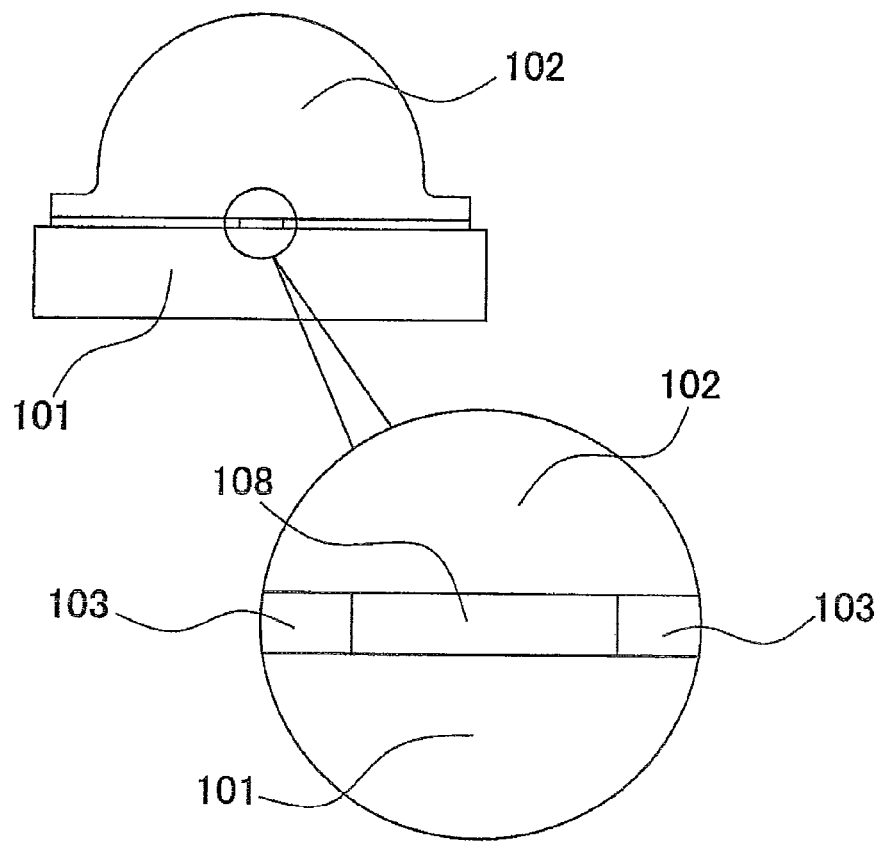
FIG. 2 is a partially enlarged schematic side view of the semiconductor device of FIG. 1.
Figure 3:
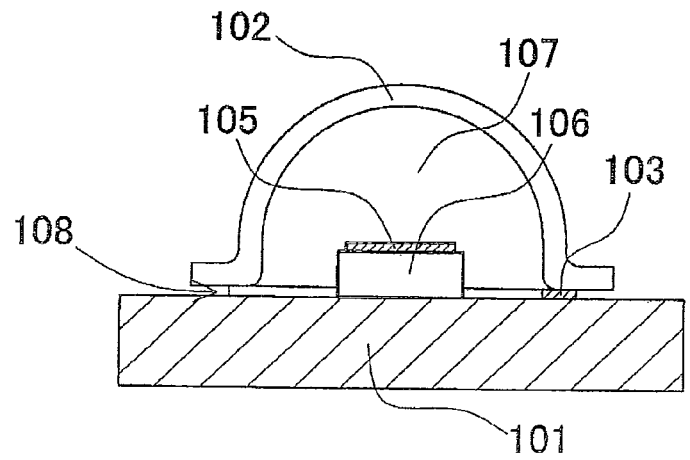
FIG. 3 is a schematic cross sectional view of the semiconductor device of FIG. 1 taken along line III-III.

FIG. 1 to FIG. 3 illustrate a first embodiment of a semiconductor device 100 according to the present invention. FIG. 1 is a schematic exploded perspective view of a semiconductor device according to a first embodiment of the present invention. FIG. 2 is a side view of a semiconductor device according to a first embodiment of the present invention, viewed from an air vent direction, and FIG. 3 is a cross sectional view showing an air vent portion.

A semiconductor device 100 of the present embodiment includes, as shown in FIG. 1, a support substrate 101 on which a semiconductor element 105 is mounted, a covering member 102 disposed on a disposing location 111 of a bonding member provided on the support substrate 101 via a bonding member (not shown). As shown in FIG. 3, a space 107 is defined surrounded by the support substrate 101 and the covering member 102, and the semiconductor element 105 is housed in the space 107.

In the present embodiment, the support substrate 101 has a protruded portion 103. As shown in FIG. 2 and FIG. 3, a portion (hereinafter referred to as "gap 104") where the protruded portion 103 and the covering member 102 are not in contact each other is defined as an air vent 108 leading from the space 107 to outside. As described above, a protruded portion 103 is formed on the support substrate 101 so that a gap 104 is defined between the support substrate 101 and the covering member 102. The gap 104 is used as an air vent so that processing of the covering member 102 can be eliminated. Thus, reduction in mechanical strength and deformation of the covering member 102 can be prevented. In addition, with this arrangement, cutting processing on the support substrate 101 is not necessary so that clogging of the air vent by the bonding member getting into a groove made by cutting processing is not going to occur.

(Support Substrate 101)

The support substrate 101 is to mount a semiconductor element 105, and has a protruded portion 103, which will be described later, on the surface thereof. The term "mount" in the specification means not only a case in which the semiconductor element 105 is directly mounted on the support substrate but also a case in which it is mounted through another auxiliary member such as a submount 106, as shown in FIG. 1.

Also, to the support substrate 101, a covering member 102, which will be described later, is disposed via a bonding member (not shown). The dashed line in FIG. 1 shows the location of the outer perimeter of the covering member 102 (hereinafter, in a similar manner as above, the dashed lines in FIG. 4 and FIG. 5 also show the outer perimeter of the covering member respectively).

Further, on the support substrate 101 of the present embodiment, a semiconductor element 105 and a conductive member (not shown), which is electrically connected with an outer electrode, are disposed. Examples of the material of the support substrate 101 include insulating members such as glass epoxy, resin, and ceramics. Particularly, a material which allows a conductive wiring to be formed on its surface is preferable as the above-described conductive member, and such a material is preferably made of ceramics having high heat resistivity and weather resistivity. As the ceramics material, alumina, aluminum nitride, mullite, or the like is preferable. Even if the support substrate is made of ceramics, an insulating layer made of an insulating material other than ceramics may also be included as a part of the support substrate. Examples of such material include BT resin, glass epoxy, and epoxy resin.

The support substrate can be formed by insert molding using a molding resin with a pair of positive and negative electrodes being as the conductive members. Examples thereof include thermoplastic resins and thermosetting resins, specifically, polyphthalamide (PPA), polycarbonate resin, polyphenylene sulfide (PPS), liquid crystal polymer (LCP), ABS resin, epoxy resin, phenol resin, acrylic resin, PBT resin, and other such resins.

(Covering Member 102)

The covering member 102 is disposed over the support substrate 101 to cover and protect the semiconductor element 105 and the conductive materials (such as a wire and bump) connected to the semiconductor element 105. A lens function can also be added to the covering member. Examples of the materials of the covering member 102 include synthetic resins such as acrylic resin, polyethylene terephthalate (PET), polycarbonate resin, silicone resin, epoxy resin, and inorganic material such as glass. Using a covering member made of inorganic material containing at least one selected from soda glass, silica glass, borosilicate glass, alumino-borosilicate glass, alumino silicate glass, oxynitride glass, and chalcogenide glass, a semiconductor device having high light resistance can be obtained.

The covering member of the present embodiment is, as shown in FIG. 1 to FIG. 3, a light translucent lens having a spherical portion defining a hemispherical space at the side facing the semiconductor element 105 and a planar portion forming an outer border with the spherical portion and is bonded to the support substrate 101. Applying a rough surface processing at the portion to be bonded to the support substrate 101 can improve the bonding strength.

A through hole penetrating in the vertical direction is defined at the portion to be bonded to the support substrate 101 and a bonding member is disposed on the inner wall defining the through hole. Resulting anchor effect allows improvement of bonding strength and compensation for difference in the amount of the bonding member. It is preferable that disposing the bonding member up to the upper surface defining the through hole, that is, to the upper surface of the covering member at the portion defining the through hole, further improves the bonding strength.

(Protruded Portion 103)

The protruded portion 103 is formed on the above-described support substrate 101. The shape of the protruded portion is not specifically limited as long as it allows disposing the covering member 102 thereon to secure a gap 104. It is preferable that the protruded portion is formed widely at the portion corresponding to the bonding surface of the covering member so that the covering member 102 can be stably disposed, and is also formed to secure the bonding member disposing portion 111 in view of the bonding strength between the covering member and the support substrate. For example, as shown in FIG. 1, a shape having a part of the circular shape being cut off can be employed.

Such protruded portion 103 can be integrally molded with, for example, the support substrate 101. The protruded portion can also be formed such that a casing having a protruded shape is formed separately from the support substrate 101 and then the support substrate and the protruded portion 103 are adhered each other. The protruded portion 103 can be formed either of the same material or of a different material than the support substrate 101. If the same material is used, deformation of the support substrate 101, separation or detachment of the protruded portion 103 from the support substrate 101 due to the difference in thermal expansion coefficient can be prevented.

It is sufficient that the thickness of the protruded portion, that is, the distance between the surface of the support substrate where the semiconductor element 105, the submount 106 or the like is mounted and the upper surface of the protruded portion 103 is such that it can serve as an air vent. For example, a range from about 5 µm to about 15 µm is preferable. With this arrangement, the air vent can be appropriately secured and foreign substances such as dart and dust can be prevented from entering the space 107. Such a relatively thin protruded portion 103 can also be formed by printing or by transcribing on the support substrate 101. For example, a shape of the protruding portion 103 can be formed by printing a ceramics layer on a ceramics support substrate. It is preferable that, with such printing, the thickness and shape of the protruded portion 103 can be made with high accuracy.

Further, as shown in FIG. 1, the protruded portion 103 is preferably formed between the bonding member disposing portion 111 and the portion where the light emitting element 105 will be mounted. With this arrangement, a function blocking the flow of the bonding member can be added to the protruded portion 103 so that the bonding member to bond the support substrate 101 with the covering member 102 is prevented from reaching the mounting portion of the light emitting element.

(Bonding Member: Not Shown)

The bonding member (not shown) is used to bond the support substrate 101 and the covering member 102, and can be made of, for example, a material which includes at least one selected from epoxy resin, polyimide resin, polyamide resin, fluorinated elastomer, glass, hot-melt material, modified silicone, and organic-inorganic hybrid resin.

(Air Vent 108)

The air vent 108 is a through hole penetrating from the space 107 to outside. As described above, the air vent is defined by the protruded portion 103 formed between the support substrate 101 and the covering member 102. Providing such an air vent allows performing the reflow process safely and reliably. Other than that, even in a case where dew condensation occurs within the light translucent covering member due to temperature difference between the space 107 and outside resulting from an abrupt change in the temperature and humidity of external environment and clouds up the light translucent covering member, the temperature and humidity of the space 107 and outside can be homogenized in a short time to eliminate the cloudiness.

(Semiconductor Element 105)

The semiconductor element 105 may be a light emitting element, a photodetector, or a protective element (e.g. a Zener diode and a condenser) that protects such semiconductor elements from damage caused by overvoltage, or a combination thereof. Here, a light emitting element (LED chip) will be described as an example of the semiconductor element. Various semiconductor such as ZnSe and GaN are used in the semiconductor light emitting elements which are a component of the light emitting element. In a case where a light emitting device having a fluorescent material is formed, a nitride semiconductor ($In_XAl_YGa_{1-X-Y}N$, $0 \leq X$, $0 \leq Y$, $X+Y \leq 1$) capable of emitting light with a short-wavelength which sufficiently excites the fluorescent material is preferably employed. Various emission wavelengths can be selected according to the materials and the mixed crystal ratio of the semiconductor layers.

The adhesive material (not shown) fixing the semiconductor element 105 and the support substrate 101 can be made of, for example, an electrically conductive adhesion material such as gold paste and silver paste, an eutectic material (for example, Au—Sn) containing at least one selected from Au, Ag, Bi, Cu, In, Pb, Sn and Zn, or a brazing material containing at least one selected from Au and Ag. With an adhesive material containing such metal material, the electrode disposed on the back surface of the semiconductor element 105 and the conductive member of the support substrate 101 can be electrically connected, or heat releasing from the semiconductor element 105 can be improved. Moreover, a light translucent resin such as epoxy resin and silicone resin can be used as the adhesive material for fixing the semiconductor element 105 and the support substrate 101.

Second Embodiment

Figure 4:
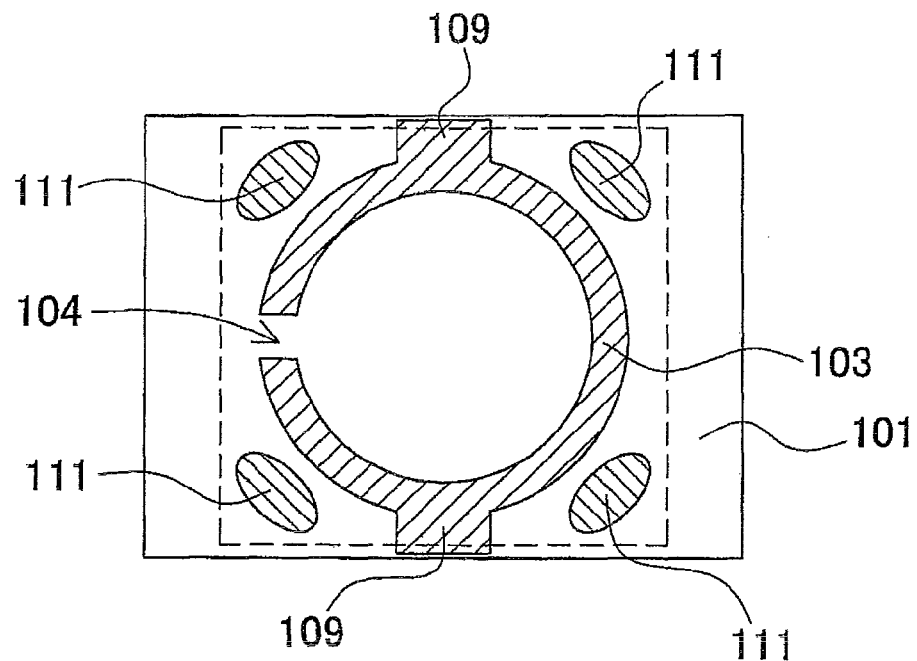
FIG. 4 is a plan view showing a support substrate of the semiconductor device according to a second embodiment of the present invention.

A semiconductor device according to the second embodiment of the present invention has, as shown in FIG. 4, a structure substantially similar to that of the first embodiment, except that an extended portion 109 extending toward outer periphery of the support substrate 101 is provided periphery of the protruded portion 103 formed on the support substrate 101. As described above, providing an extended portion capable of supporting a larger area to the end portion of the covering member 102 enables stable arrangement of the covering member 102. In view of the unevenness in disposing the covering member 102, as shown in FIG. 4, at least a portion of the upper surface of the extended portion 109 is extended so as to be exposed without covered by the covering member 102, so that the covering member can be disposed more stably.

It is preferable that, in plan view, the extended portions 109 are disposed symmetrical to each other with respect to the symmetrical axis, and the bonding member disposing portions 111 are provided among a plurality of the extended portions 109, and then the bonding member is disposed thereto. With this arrangement, each of the plurality of the bonding member disposing portions 111 can limit the range of the bonding member to flow, so that the bonding member can be disposed evenly.

Third Embodiment

Figure 5:
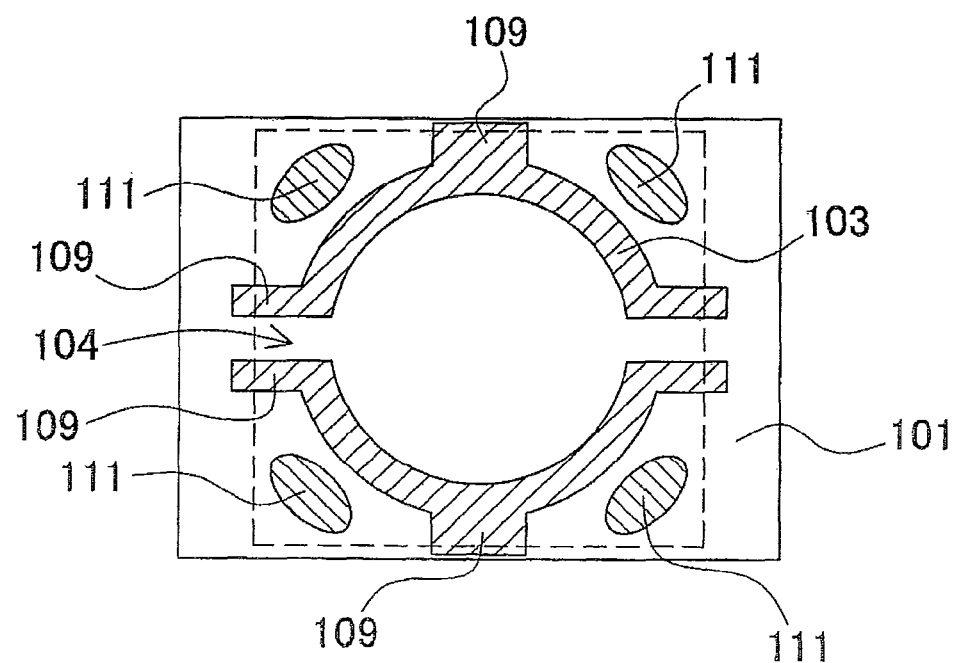
FIG. 5 is a plan view showing a support substrate of the semiconductor device according to a third embodiment of the present invention.

A semiconductor device according to the third embodiment of the present invention has, as shown in FIG. 5, a structure substantially similar to that of the second embodiment, except that extended portions 109 extending outwardly from the semiconductor device are provided at six locations in the periphery of the protruded portion 103 formed on the support substrate 101, at least a pair of the extended portions 109 is facing each other via an interval, and the interval is defined to connect to the gap 104 to serve as an air vent. As described above, the extended portions defining the air vent are provided protruded from the covering member 102. With this arrangement, the flow of the bonding member can be blocked at the extended portions, so that the possibility of the air vent getting clogged by the bonding member flowed therein can be excluded.

Example

Figure 6:
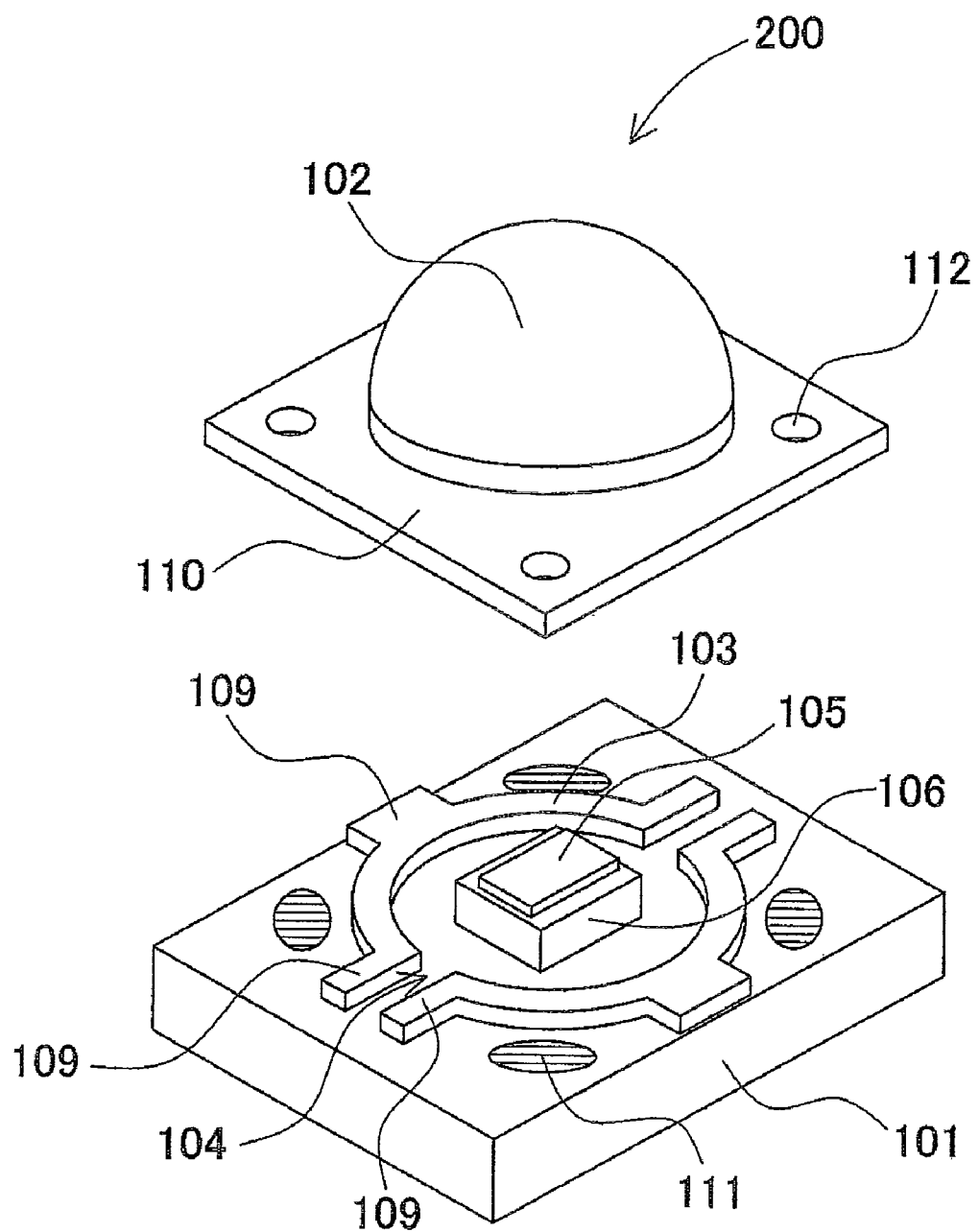
FIG. 6 is a schematic exploded perspective view of a semiconductor device of FIG. 5.

Next, examples of the present invention will be described below with reference to FIG. 6, but the present invention is not limited thereto.

A semiconductor device 200 according to the present example includes a support substrate 101 made of ceramics and a protruded portion 103 of about 10 μm thickness formed by printing ceramics. The support substrate 101 and the protruded portion 103 are formed using the same material, so that deformation and separation or detachment of the support substrate 101 due to the difference in thermal coefficient can be prevented. A conductive wiring (not shown) is provided to the support substrate 101, so that the support substrate 101 is electrically connected to the semiconductor element 105 and also serves as an external electrode connected to an external electrode. A semiconductor element 105 is mounted on the support substrate 101 through a submount 106. In the present example, a light emitting element having a nitride semiconductor capable of emitting blue light (470 nm) as its light emitting layer is used as the semiconductor element. The light emitting surface of the light emitting element is coated with a YAG phosphor (not shown), so that a light emitting device capable of emitting a white light can be obtained.

The protruded portion 103 has, at six locations in its periphery, extended portions 109 extending outward from the semiconductor device and having the upper surfaces being exposed without being covered with the covering member. These extended portions are disposed, in plan view, symmetrical to each other with respect to the axis of symmetry. Further, four of the extended portions are formed so that two pairs of them are facing each other via an interval, and the intervals are connected to the gap 104 to provide an air vent. As described above, the extended portions defining the air vent are provided protruded from the covering member 102. With this arrangement, the flow of the bonding member can be blocked at the extended portions, so that the possibility of the air vent getting clogged by the bonding member flowed therein can be excluded.

Moreover, in the present example, the covering member 102 is made of glass and has a metal member 110 at the portion to be bonded to the support substrate 101. Thus, the connecting portion is made of a metal which does not transmit light, so that the bonding member can be prevented from deterioration caused by external light. In addition, a through-hole 112 penetrating in the vertical direction is defined in the metal member 110. Further, a rough surface processing is provided on the connecting portion with the support substrate 101, and resulting anchor effect allows improvement of bonding strength and compensation for difference in the amount of the bonding member.

As described above, disposing the covering member 102 to the support substrate 101 with using the bonding member, the gap 104 is defined by the protruded portion 103 located between the support substrate 101 and the covering member 102, and the gap 104 can be used as an air vent. Accordingly, it becomes possible to eliminate a processing of the covering member while providing the air vent, and to prevent decrease in the mechanical strength and deformation.

INDUSTRIAL APPLICABILITY

As a semiconductor device of high reliability, the semiconductor device according to the present invention can be applied widely as the light source for household lighting and vehicular lighting.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims. The present application is based on Application No. 2008-140214 filed in Japan on May 29, 2008, the content of which is incorporated herein by reference.

What is claimed is:
1. A semiconductor device comprising:
a semiconductor element;
a support substrate on which the semiconductor element is mounted; and
a covering member disposed to the support substrate via a bonding member,
wherein a space is defined between the covering member and the support substrate and the semiconductor clement is located in said space,
the support substrate has a protruded portion and the covering member is partially in contact with the protruded portion to open an air vent leading from said space to outside at an interface between the support substrate and the covering member, and
the protruded portion defines an area for a portion for disposing the bonding member, said portion for disposing the bonding member being positioned outside of the protruded portion.
2. The semiconductor device according to claim 1, wherein the covering member has a hemispherical spherical portion defining the space and has a planar portion which is at an outer periphery of the spherical portion and is bonded to the support substrate.
3. The semiconductor device according to claim 2, wherein a rough surface is formed in a surface of the planar portion to be bonded to the support substrate.
4. The semiconductor device according to claim 2, wherein the protruded portion is formed at a portion facing the planar portion.
5. The semiconductor device according to claim 4, wherein the protruded portion is formed in a shape having a part of the circular shape being cut off.
6. The semiconductor device according to claim 1, wherein the protruded portion is formed between the portion for disposing the bonding member and the portion for mounting the semiconductor element, and
wherein the portion for mounting the semiconductor clement is divided from said portion for disposing the bonding, member by the protruded portion.

7. The semiconductor device according to claim 1, wherein the surface of the covering member which is in contact with the support substrate defines a through hole penetrating in vertical direction and the bonding member is disposed on a side surface defining the through hole.

8. The semiconductor device according to claim 1, wherein the protruded portion has an extended portion extending in the periphery direction of the support substrate and at least a portion of an upper surface of the extended portion is exposed without being covered by the covering member.

9. The semiconductor device according to claim 8, wherein in a plan view, the extended portion is formed symmetrically with respect to the axis of symmetry.

10. The semiconductor device according to claim 8, wherein
at least a pair of the extended portions is formed facing to each other through a gap, and the gap provides an air vent.

11. The semiconductor device according to claim 1, wherein
the bonding member is disposed to a plurality of portions.

12. A semiconductor device comprising:
a semiconductor element;
a support substrate on which the semiconductor element is mounted; and
a covering member disposed to the support substrate via a bonding member,
wherein a space is defined between the covering member and the support substrate and the semiconductor element is located in the space,
wherein the support substrate has a protruded portion and the covering member is partially in contact with the protruded portion to open an air vent leading from the space to outside at an interface between the support substrate and the covering member, and
wherein the surface of the covering member which is in contact with the support substrate defines a through hole penetrating in vertical direction and the bonding member is disposed on a side surface defining the through hole.

13. The semiconductor device according to claim 12, wherein
the covering member has a hemispherical spherical portion defining the space and has a planar portion which is at an outer periphery of the spherical portion and is bonded to the support substrate.

14. The semiconductor device according to claim 13, wherein
a rough surface is formed in a surface of the planar portion to he bonded to the support substrate.

15. The semiconductor device according to claim 13, wherein
the protruded portion is formed at a portion facing the planar portion.

16. The semiconductor device according to claim 15, wherein
the protruded portion is formed in a shape having a part of the circular shape being cut off.

17. A semiconductor device comprising:
a semiconductor element;
a support substrate on which the semiconductor element is mounted; and
a covering member disposed to the support substrate via a bonding member,
wherein a space is defined between the covering member and the support substrate and the semiconductor element is located in the space,
wherein the support substrate has a protruded portion and the covering member is partially in contact with the protruded portion to open an air vent leading from the space to outside at an interface between the support substrate and the covering member, and
wherein the protruded portion has an extended portion extending in the periphery direction of the support substrate and at least a portion of an upper surface of the extended portion is exposed without being covered by the covering member.

18. The semiconductor device according to claim 17, wherein
in a plan view, the extended portion is formed symmetrically with respect to the axis of symmetry.

19. The semiconductor device according to claim 17, wherein
at least a pair of the extended portions is formed facing to each other through a gap, and the gap provides an air vent.

20. The semiconductor device according to claim 17, wherein
the bonding member is disposed to a plurality of portions.

* * * * *